(12) United States Patent
Takakura et al.

(10) Patent No.: US 12,040,243 B2
(45) Date of Patent: Jul. 16, 2024

(54) MODULE

(71) Applicant: Murata Manufacturing Co., Ltd., Kyoto-fu (JP)

(72) Inventors: Tsuyoshi Takakura, Kyoto-fu (JP); Takafumi Kusuyama, Kyoto-fu (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 431 days.

(21) Appl. No.: 17/382,815

(22) Filed: Jul. 22, 2021

(65) Prior Publication Data

US 2021/0351093 A1 Nov. 11, 2021

Related U.S. Application Data

(63) Continuation of application No. PCT/JP2020/001859, filed on Jan. 21, 2020.

(30) Foreign Application Priority Data

Jan. 24, 2019 (JP) .................................. 2019-010600

(51) Int. Cl.
  *H01L 23/12* (2006.01)
  *H01L 23/31* (2006.01)
  (Continued)

(52) U.S. Cl.
  CPC .......... *H01L 23/12* (2013.01); *H01L 23/3121* (2013.01); *H01L 25/065* (2013.01);
  (Continued)

(58) Field of Classification Search
  CPC . H01L 23/5389; H01L 23/5384; H01L 23/12; H01L 23/5385; H01L 23/49816;
  (Continued)

(56) References Cited

U.S. PATENT DOCUMENTS 5,072,075 A * 12/1991 Lee .................... H05K 3/4641
  29/830
7,649,252 B2 * 1/2010 Sakai .................. H01L 25/165
  257/703

(Continued)

FOREIGN PATENT DOCUMENTS

JP   3740469 B2   2/2006
JP   2012-028487 A   2/2012
(Continued)

OTHER PUBLICATIONS

International Search Report for International Patent Application No. PCT/JP2020/001859 dated Mar. 31, 2020.
(Continued)

*Primary Examiner* — Jaehwan Oh
*Assistant Examiner* — John M Parker
(74) *Attorney, Agent, or Firm* — Pearne & Gordon LLP

(57) ABSTRACT

A module includes a substrate including a first main surface, a columnar conductor arranged on the first main surface, a first sealing resin that seals at least the columnar conductor and the first main surface while exposing a first end surface of the columnar conductor, a conductive film connected to the columnar conductor and arranged to extend laterally from the first end surface, a resin sheet arranged to cover at least the conductive film, a conductor via provided in the resin sheet and having one end connected to the conductive film, and a conductor pattern arranged on a surface of the resin sheet on a side far from the substrate to be connected to the other end of the conductor via and being larger in area than the first end surface.

11 Claims, 9 Drawing Sheets

(51) Int. Cl.
  *H01L 25/065* (2023.01)
  *H01L 25/07* (2006.01)
  *H01L 25/18* (2023.01)
  *H05K 3/28* (2006.01)
  *H05K 3/46* (2006.01)

(52) U.S. Cl.
  CPC ............ *H01L 25/071* (2013.01); *H01L 25/18* (2013.01); *H05K 3/28* (2013.01); *H05K 3/46* (2013.01)

(58) Field of Classification Search
  CPC ... H01L 24/19; H01L 25/0657; H01L 25/065; H01L 25/18
  See application file for complete search history.

(56) References Cited

U.S. PATENT DOCUMENTS

| | | | | |
|---|---|---|---|---|
| 9,406,658 | B2* | 8/2016 | Lee | H01L 23/5389 |
| 9,960,328 | B2* | 5/2018 | Clark | H01L 21/563 |
| 10,887,977 | B2* | 1/2021 | Leitgeb | H01L 23/5385 |
| 11,419,211 | B2* | 8/2022 | Sato | H05K 3/40 |
| 2002/0117743 | A1* | 8/2002 | Nakatani | H01L 23/5389 257/788 |
| 2004/0183192 | A1 | 9/2004 | Otsuka et al. | |
| 2007/0026196 | A1 | 2/2007 | Ogawa et al. | |
| 2010/0072611 | A1* | 3/2010 | Oikawa | H01L 23/3107 257/702 |
| 2012/0248933 | A1 | 10/2012 | Tsuda | |
| 2014/0151860 | A1 | 6/2014 | Nakamura et al. | |
| 2015/0279820 | A1 | 10/2015 | Usami et al. | |
| 2017/0062370 | A1 | 3/2017 | Shiraki et al. | |
| 2019/0364660 | A1 | 11/2019 | Sato et al. | |

FOREIGN PATENT DOCUMENTS

| | | |
|---|---|---|
| JP | 2012-217136 A | 11/2012 |
| JP | 2015-195263 A | 11/2015 |
| JP | 5831057 B2 | 12/2015 |
| JP | 2017-050310 A | 3/2017 |
| WO | 2005/071745 A1 | 8/2005 |
| WO | 2013/121732 A1 | 8/2013 |
| WO | 2018/150724 A1 | 8/2018 |

OTHER PUBLICATIONS

Written Opinion for International Patent Application No. PCT/JP2020/001859 dated Mar. 31, 2020.

* cited by examiner

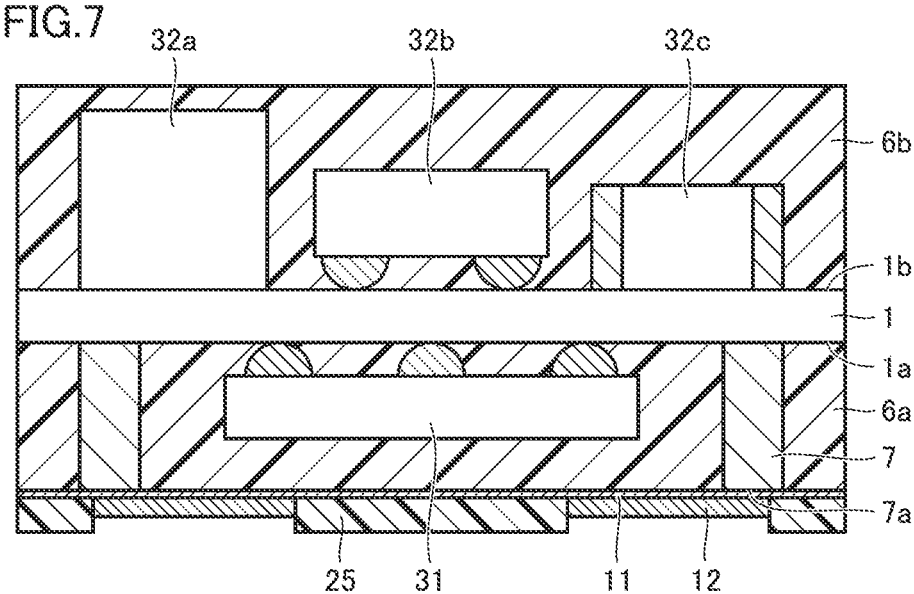
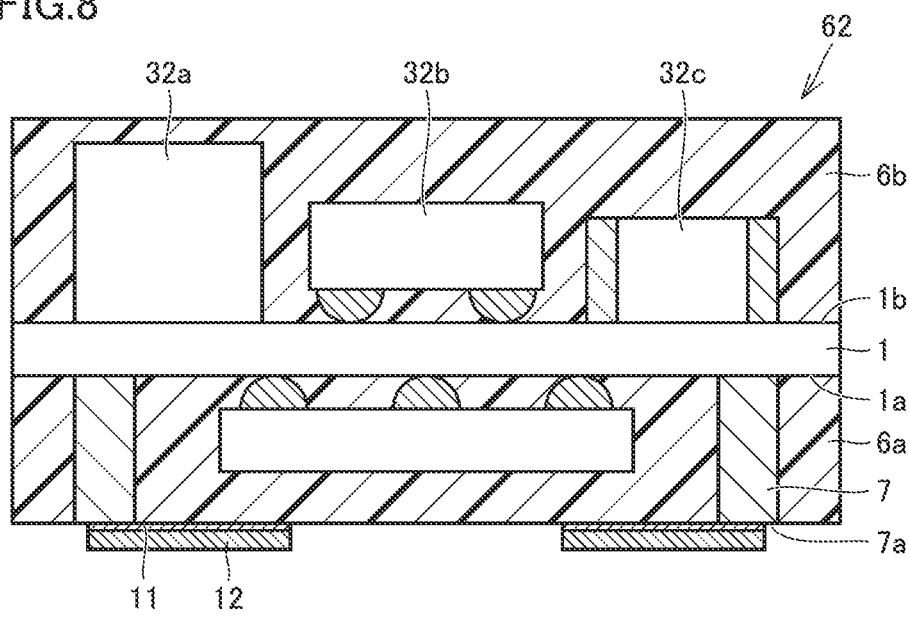

MODULE

CROSS REFERENCE TO RELATED APPLICATIONS

This is a continuation of International Application No. PCT/JP2020/001859 filed on Jan. 21, 2020 which claims priority from Japanese Patent Application No. 2019-010600 filed on Jan. 24, 2019. The contents of these applications are incorporated herein by reference in their entireties.

BACKGROUND OF THE DISCLOSURE

Field of the Disclosure

The present disclosure relates to a module.

Description of the Related Art

Japanese Patent No. 5831057 (PTL 1) describes an exemplary module including a columnar connection terminal.

PTL 1: Japanese Patent No. 5831057

BRIEF SUMMARY OF THE DISCLOSURE

As described in PTL 1, for connection of the module to another component, a structure in which an end surface of the columnar connection terminal is exposed at a surface is applicable as an external connection terminal. With a more sophisticated function and higher density of a module in recent years, the number of connection terminals has increased. With reduction in size of the module, on the other hand, a pitch between arranged connection terminals is smaller.

Since an area of an end surface of each connection terminal is small, electrical connection may not sufficiently be secured in case of displacement of a position relative to a connection terminal of another component connected to the module. In particular, with demands for reduction in size and higher density of the module, improvement in reliability of electrical connection is an important issue.

An object of the present disclosure is to provide a module that well accommodates an error in position displacement from a connection terminal of another component connected to the module and is improved in reliability of electrical connection.

In order to achieve the object, a module based on the present disclosure includes a substrate including a first main surface and a second main surface that faces a direction opposite to the first main surface, a columnar conductor arranged on the first main surface, a first sealing resin that seals at least the columnar conductor and the first main surface while exposing a first end surface which is an end surface of the columnar conductor on a side far from the substrate, a conductive film connected to the columnar conductor by covering at least a part of the first end surface and arranged to extend laterally from the first end surface, a resin sheet arranged to cover at least a surface of the conductive film on the side far from the substrate, a conductor via provided in the resin sheet and having one end connected to the conductive film, and a conductor pattern arranged on a surface of the resin sheet on the side far from the substrate to be connected to the other end of the conductor via and being larger in area than the first end surface.

According to the present disclosure, the conductor pattern larger in area than the first end surface of the columnar conductor can serve as an external connection electrode. Therefore, a module that well accommodates an error in position displacement from a connection terminal of another component connected to the module and is improved in reliability of electrical connection can be realized.

BRIEF DESCRIPTION OF THE SEVERAL VIEWS OF THE DRAWINGS

FIG. 7 is an illustrative view of a fourth step in the method of manufacturing a module in the first embodiment based on the present disclosure.

FIG. 8 is a cross-sectional view of the structure obtained in a fifth step in the method of manufacturing a module in the first embodiment based on the present disclosure.

DETAILED DESCRIPTION OF THE DISCLOSURE

Figure 1:
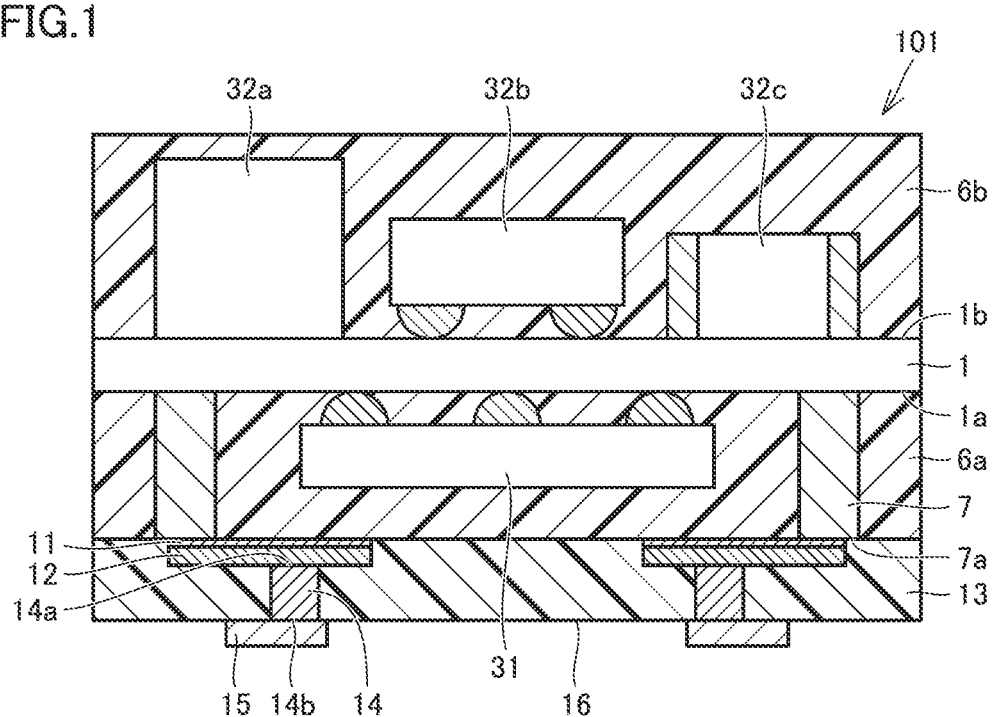
FIG. 1 is a cross-sectional view of a module in a first embodiment based on the present disclosure.

A dimensional ratio shown in the drawings does not necessarily faithfully represent an actual dimensional ratio, and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

Figure 2:
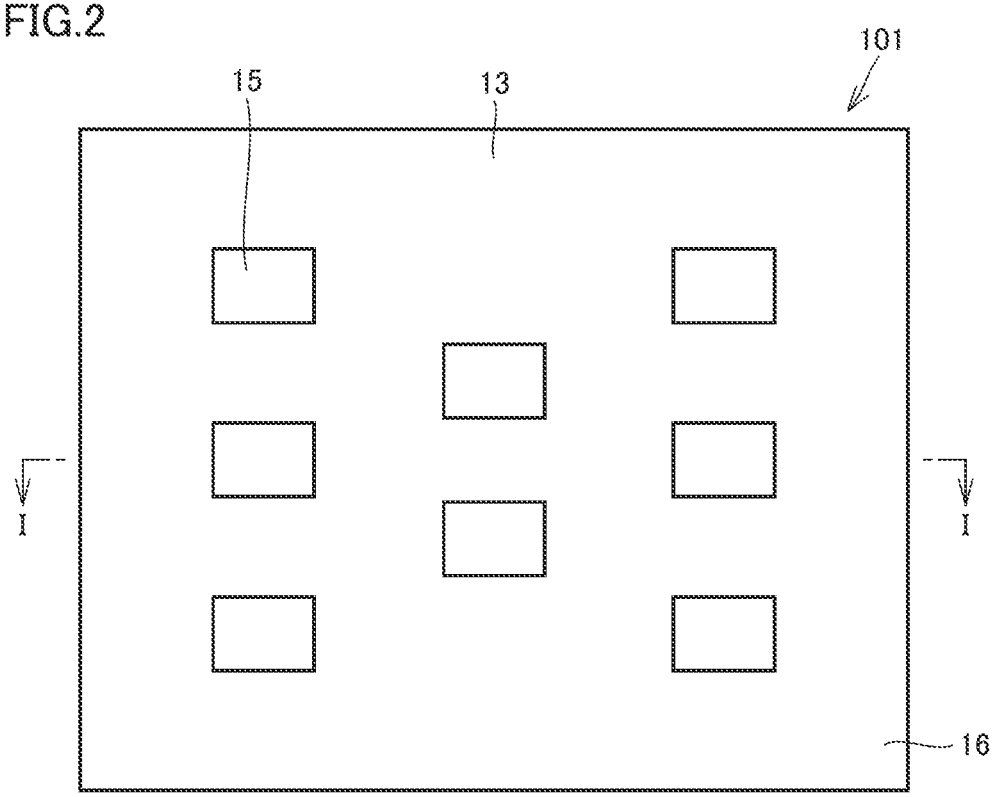
FIG. 2 is a bottom view of the module in the first embodiment based on the present disclosure.

A module in a first embodiment based on the present disclosure will be described with reference to FIGS. 1 to 2. FIG. 1 shows a cross-sectional view of a module 101 in the present embodiment. FIG. 2 shows a bottom view of module 101. FIG. 1 corresponds to a cross-sectional view along the line I-I in FIG. 2.

Module 101 includes a substrate 1, a columnar conductor 7, a first sealing resin 6a, a conductive film 12, a resin sheet 13, a conductor via 14, and a conductor pattern 15. Substrate 1 includes a first main surface 1a and a second main surface 1b. Second main surface 1b faces a direction opposite to first main surface 1a. Columnar conductor 7 is arranged to stand on first main surface 1a. First sealing resin 6a seals at least columnar conductor 7 and first main surface 1a while exposing a first end surface 7a which is an end surface of columnar conductor 7 on a side far from substrate 1. Conductive film 12 is electrically connected to columnar conductor 7 by covering at least a part of first end surface 7a. Conductive film 12 is arranged to extend laterally from first end surface 7a. Resin sheet 13 is arranged to cover at least a surface of conductive film 12 on the side far from substrate 1. Conductor via 14 includes one end 14a and the other end 14b. Conductor via 14 is provided to pass through resin sheet 13 in a direction of thickness. Conductor via 14 is electrically connected to conductive film 12 at one end 14a. Conductor pattern 15 is arranged on a surface of resin sheet 13 on the side far from substrate 1 so as to electrically be connected to the other end 14b of conductor via 14. Conductor pattern 15 is larger in area than first end surface 7a.

A first component 31 is mounted on first main surface 1a. First component 31 may be, for example, an integrated circuit (IC) chip. First component 31 is mounted substantially in the center of first main surface 1a. First component 31 is sealed with first sealing resin 6a.

Second components 32a, 32b, and 32c are mounted on second main surface 1b. Second components 32a, 32b, and 32c are sealed with a second sealing resin 6b.

A surface 16 in FIG. 2 is a surface opposed to a mother substrate or the like in mounting module 101 on the mother substrate or the like. Conductor pattern 15 plays a role as an external connection electrode in mounting module 101. Conductor pattern 15 may be arranged as desired. Though FIG. 2 shows eight conductor patterns 15, a shape, a size, the number, and positional relation of conductor patterns 15 shown here are merely by way of example and are not necessarily as such.

In module 101 in the present embodiment, first end surface 7a of columnar conductor 7 is not exposed as it is as the external connection electrode but columnar conductor 7 is electrically connected to conductor pattern 15 being larger in area than first end surface 7a, with conductive film 12 arranged to extend laterally from first end surface 7a being interposed and further with conductor via 14 being interposed. Since conductor pattern 15 having a large area is exposed as the external connection electrode, the module well accommodates an error in position displacement from a connection terminal of another component connected to the module and is improved in reliability of electrical connection.

In general, the module has been reduced in size, and accordingly, the columnar conductor provided in the module has also been decreased in diameter. In an attempt for connection to a mother substrate or the like by using the end surface of the columnar conductor directly as the external connection terminal, an amount of solder used for connection should be increased for ensuring sufficient connection, because the end surface of the columnar conductor is small in area. Increase in amount of solder as such, however, leads to possibility of short-circuiting between terminals by solder that squeezes out of the end surface. As shown in the present embodiment, however, with the use of the conductor pattern as the external connection terminal, a large area of the conductor pattern can be set and therefore solder can be accommodated in an area of the conductor pattern. Consequently, solder is less likely to squeeze out of the conductor pattern as the external connection terminal. Therefore, in the present embodiment, possibility of short-circuiting between terminals by solder in mounting the module on a mother substrate or the like by solder connection can be lowered.

Conductive film 12 is preferably larger in area than first end surface 7a and one end 14a of conductor via 14. By adopting such a construction, even when an area of first end surface 7a is too small, conductive film 12 can electrically draw the conductor to a desired position and a large area in which next electrical connection can be accepted is secured. Since position accuracy of a portion of connection between the conductive film and the conductor via does not have to be high, the module can be made by arranging a resin sheet having a conductor via formed in advance. According to such a construction, a module that well accommodates an error in position displacement from a connection terminal of another component connected to the module, that is, for example, another component such as a mother substrate, and is improved in reliability of electrical connection can be provided at low cost.

As shown in the present embodiment, preferably, at least first component 31 is mounted on first main surface 1a, first component 31 is covered with first sealing resin 6a, and at least a second component is mounted on second main surface 1b. By thus mounting a component on opposing surfaces of substrate 1, the module can include a large number of components. Though the present embodiment illustrates the construction in which only a single first component 31 is mounted on first main surface 1a, a plurality of first components may be mounted on first main surface 1a. Though a construction in which three second components 32a, 32b, and 32c are mounted on second main surface 1b is illustrated in the present embodiment, one second component, two second components, or at least four second components may be mounted on the second main surface.

(Manufacturing Method)

A method of manufacturing a module in the present embodiment will be described with reference to FIGS. 3 to 16. Though description proceeds with reference to a size of a single module for the sake of convenience of description, such a method as making a structure corresponding to a plurality of modules in an integrated substrate and dividing the integrated substrate finally into a size of an individual module may actually be adopted.

Figure 3:
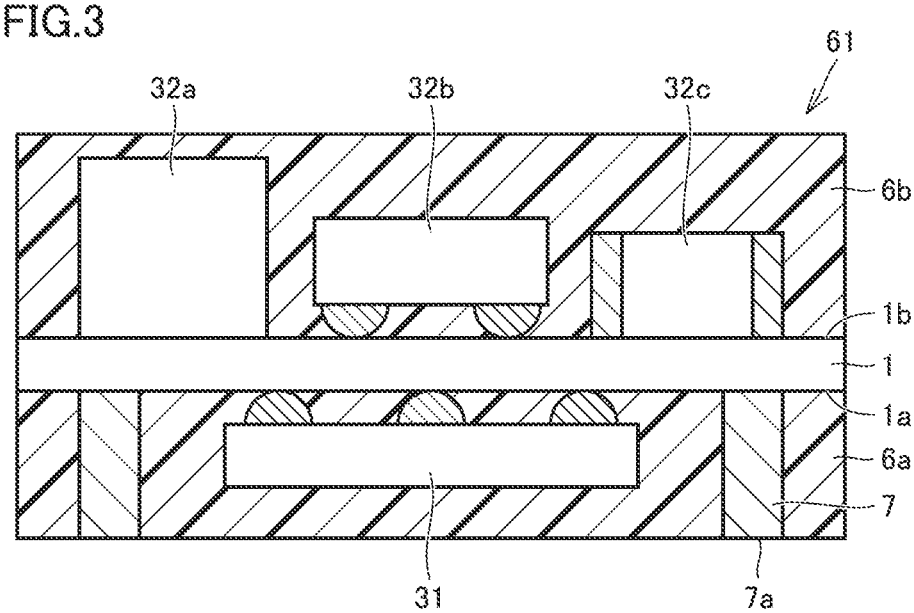
FIG. 3 is a cross-sectional view of a structure prepared in a first step in a method of manufacturing a module in the first embodiment based on the present disclosure.
Figure 4:
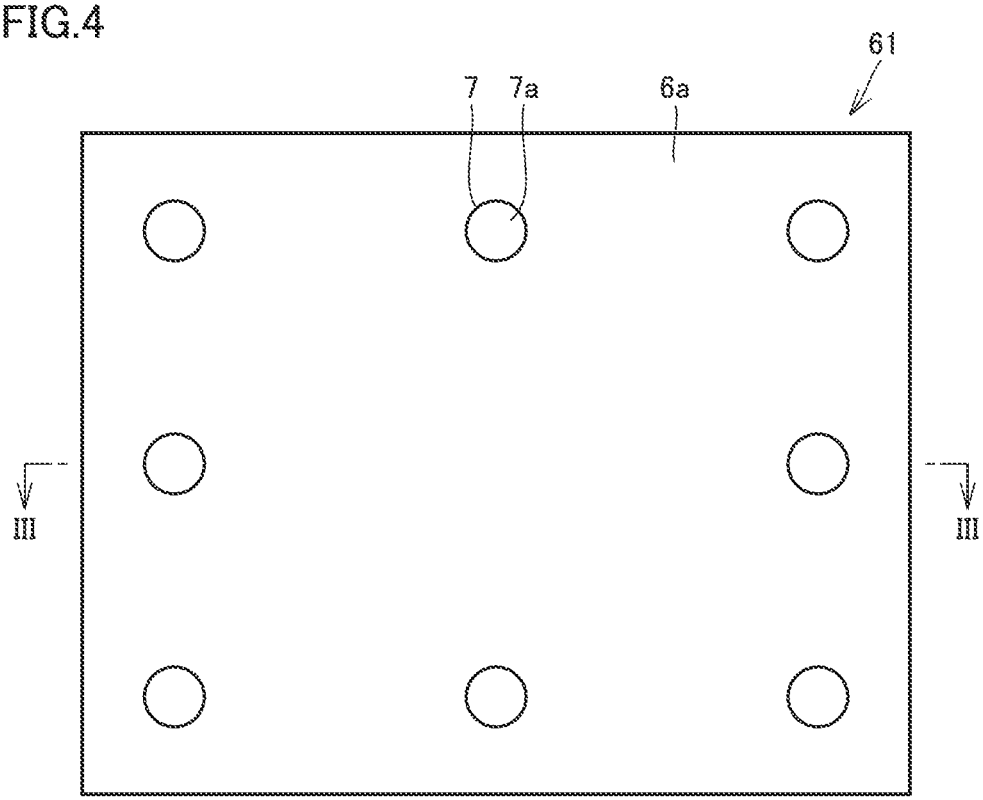
FIG. 4 is a bottom view of the structure prepared in the first step in the method of manufacturing a module in the first embodiment based on the present disclosure.
Figure 5:
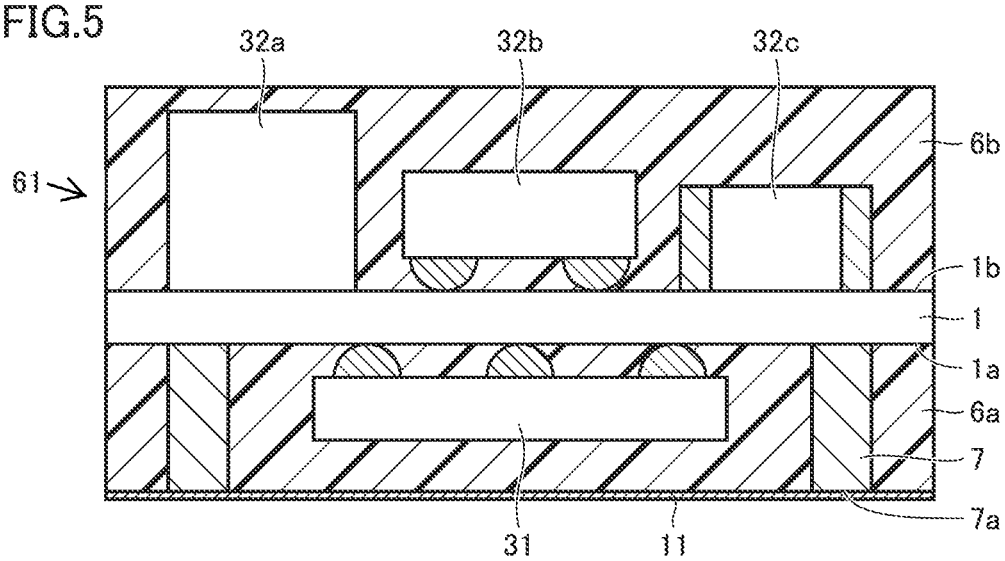
FIG. 5 is an illustrative view of a second step in the method of manufacturing a module in the first embodiment based on the present disclosure.

Initially, a structure 61 shown in FIG. 3 is prepared. Structure 61 includes substrate 1. Substrate 1 includes first main surface 1*a* and second main surface 1*b*. First component 31 is mounted on first main surface 1*a*. Second components 32*a*, 32*b*, and 32*c* are mounted on second main surface 1*b*. Columnar conductor 7 is erected on first main surface 1*a*. First sealing resin 6*a* is provided to cover component 31 located on first main surface 1*a*. Second sealing resin 6*b* is provided to cover second components 32*a*, 32*b*, and 32*c* located on second main surface 1*b*. FIG. 4 shows a bottom view of structure 61. FIG. 3 corresponds to a cross-sectional view along the line in FIG. 4. Then, as shown in FIG. 5, a seed layer 11 is formed on a lower surface of structure 61. Seed layer 11 may be formed to cover the entire lower surface of structure 61. Seed layer 11 may be formed, for example, by sputtering. Seed layer 11 may be formed, for example, of Cu. Seed layer 11 may be composed of at least two layers as being combined. For example, seed layer 11 may be in a two-layered structure obtained by initially forming a Ti layer and then forming a Cu layer.

Figure 6:
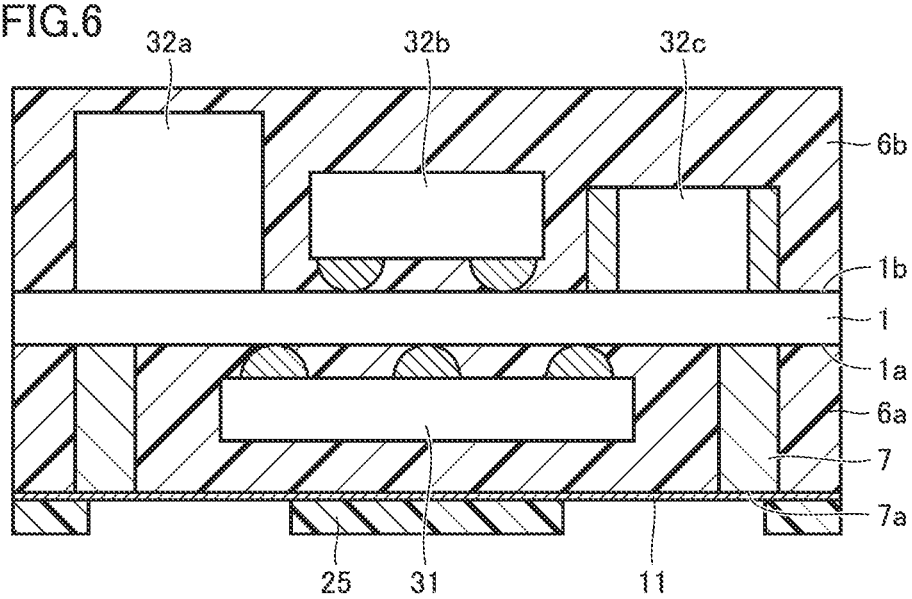
FIG. 6 is an illustrative view of a third step in the method of manufacturing a module in the first embodiment based on the present disclosure.

A resist layer is formed to cover a lower surface of seed layer 11 and the resist layer is patterned. The resist layer can be patterned, for example, by photolithography. When a positive resist material is used for the resist layer, a UV optical mask having a desired pattern formed is prepared, and the resist film is irradiated with UV rays with the mask being interposed, to partially expose the resist film to UV to thereby remove the resist film in a portion exposed to UV with a developer. Consequently, a state that a resist pattern 25 is formed as shown in FIG. 6 is obtained. Though a step in which the positive resist material is used for the resist layer is described, a negative resist material may be used for the resist layer.

Figure 9:
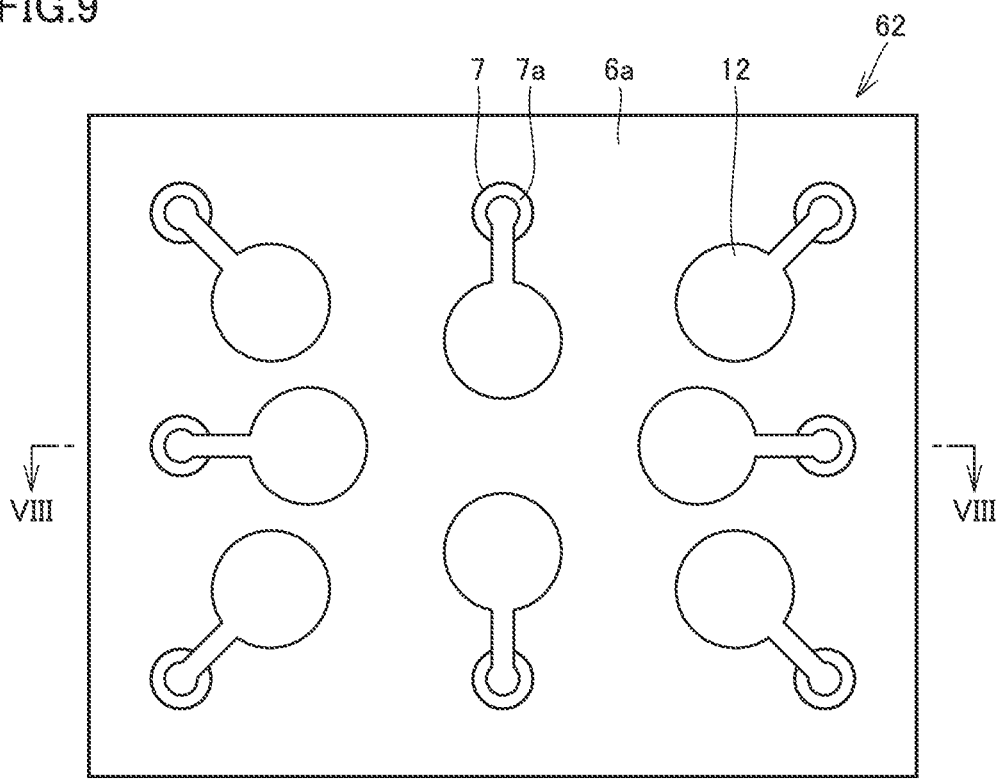
FIG. 9 is a bottom view of the structure obtained in the fifth step in the method of manufacturing a module in the first embodiment based on the present disclosure.

As shown in FIG. 7, conductive film 12 is grown. Conductive film 12 may be, for example, a Cu layer. Conductive film 12 may be, for example, a plated film. Conductive film 12 is grown, for example, by electrolytic copper plating. Conductive film 12 is grown in a region of the lower surface of seed layer 11 not covered with resist pattern 25. After conductive film 12 is formed, resist pattern 25 is removed. Furthermore, a portion of seed layer 11 not covered with conductive film 12 is etched away. Consequently, a structure 62 shown in FIG. 8 is obtained. In structure 62, seed layer 11 remains only in the region superimposed on conductive film 12. FIG. 9 shows a bottom view of structure 62. FIG. 8 corresponds to a cross-sectional view along the line VIII-VIII in FIG. 9. The conductive film may be formed by film formation by sputtering or the like.

Figure 10:
FIG. 10 is an illustrative view of the first step in connection with a resin sheet used in the method of manufacturing a module in the first embodiment based on the present disclosure.
Figure 11:
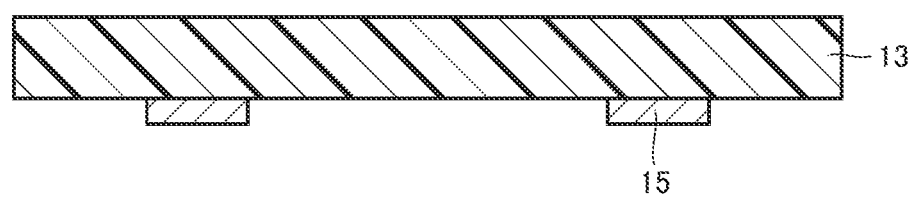
FIG. 11 is an illustrative view of the second step in connection with the resin sheet used in the method of manufacturing a module in the first embodiment based on the present disclosure.
Figure 12:
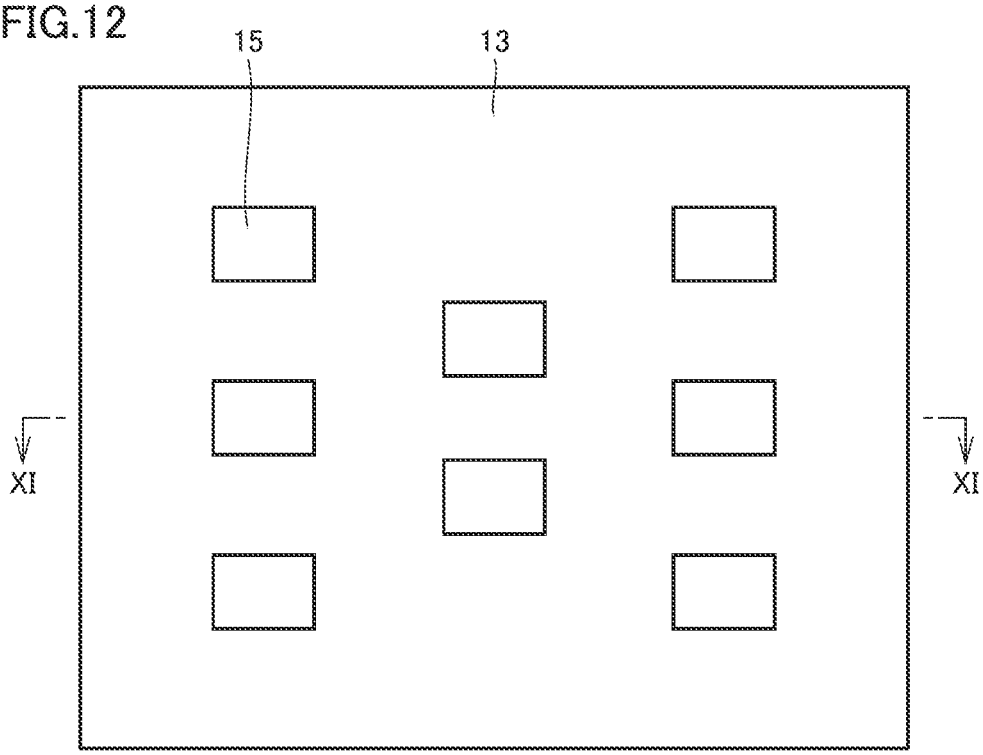
FIG. 12 is a bottom view of the structure obtained in the second step in connection with the resin sheet used in the method of manufacturing a module in the first embodiment based on the present disclosure.

As shown in FIG. 10, a member in which a conductor foil 15*e* is provided on one surface of resin sheet 13 is prepared. Conductor foil 15*e* may be, for example, a copper foil. By patterning conductor foil 15*e*, a structure shown in FIG. 11 is obtained. In FIG. 11, conductor pattern 15 is formed on one surface of resin sheet 13. FIG. 12 shows a bottom view of this structure.

Figure 13:
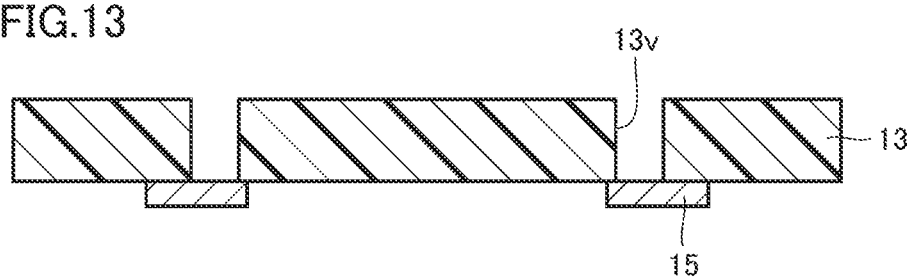
FIG. 13 is an illustrative view of the third step in connection with the resin sheet used in the method of manufacturing a module in the first embodiment based on the present disclosure.
Figure 14:
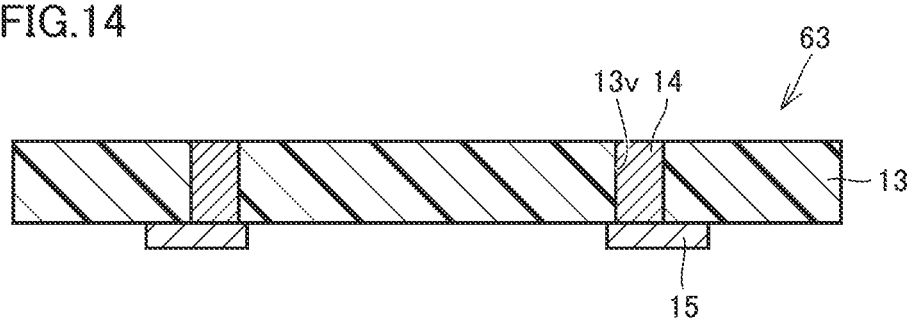
FIG. 14 is an illustrative view of the fourth step in connection with the resin sheet used in the method of manufacturing a module in the first embodiment based on the present disclosure.
Figure 15:
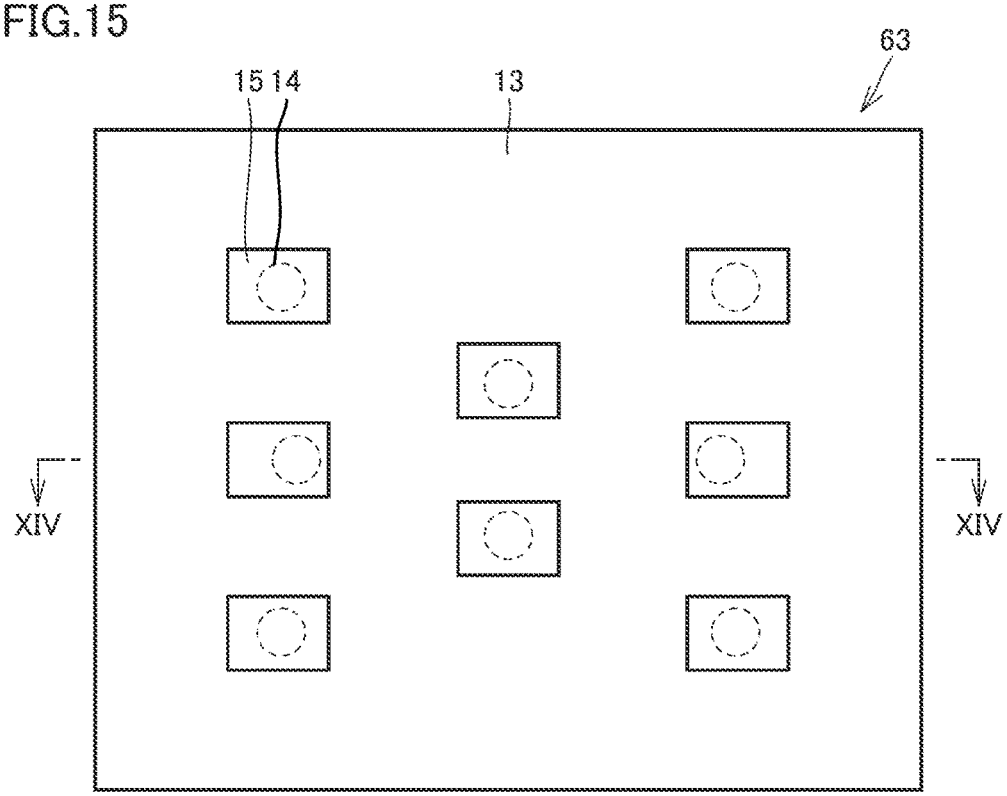
FIG. 15 is a bottom view of the structure obtained in the fourth step in connection with the resin sheet used in the method of manufacturing a module in the first embodiment based on the present disclosure.

As shown in FIG. 13, a hole 13*v* is provided in resin sheet 13. Hole 13*v* may be provided by laser machining. Hole 13*v* passes through resin sheet 13 in the direction of thickness. One end of hole 13*v* is covered with conductor pattern 15. By filling hole 13*v* with a conductive paste, conductor via 14 as shown in FIG. 14 is formed. A structure 63 is thus obtained. FIG. 15 shows a bottom view of structure 63. FIG. 14 corresponds to a cross-sectional view along the line XIV-XIV in FIG. 15. FIG. 15 shows with a dashed line, conductor via 14 located behind conductor pattern 15 when facing the sheet plane. Conductor pattern 15 will subsequently serve as the external connection electrode. At this time point, structure 63 may be uncured. The steps described with reference to FIGS. 10 to 15 are not necessarily performed after the steps described with reference to FIGS. 3 to 9 and they may be performed in advance to prepare structure 63.

Figure 16:
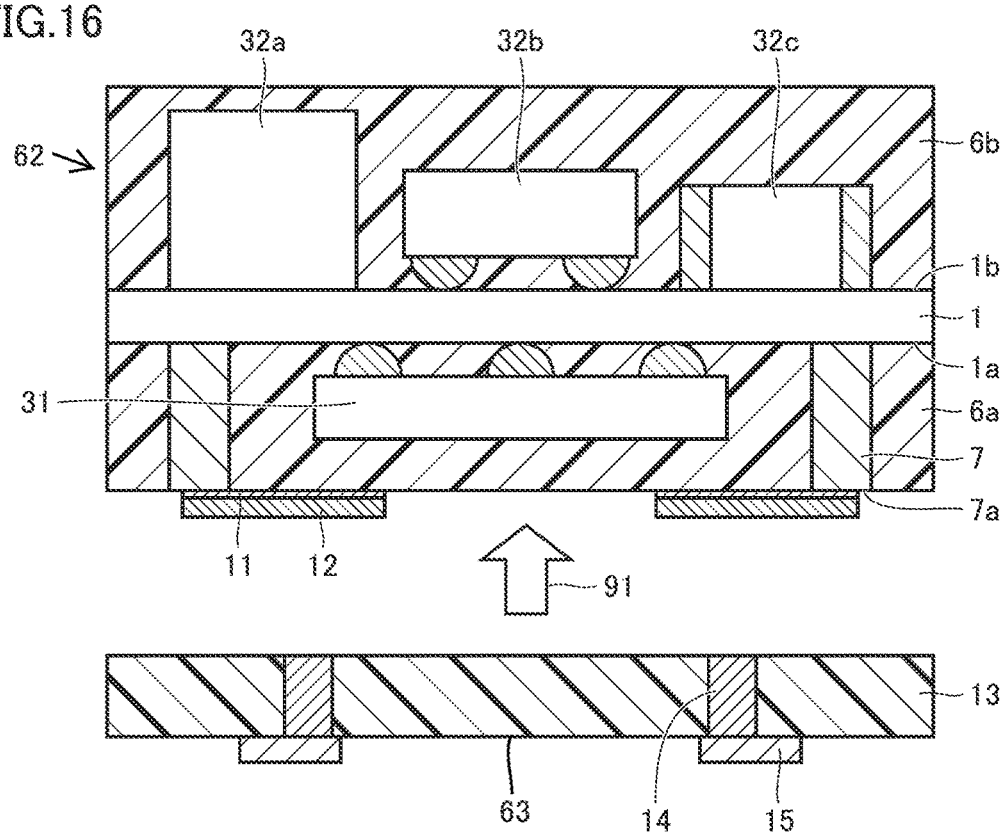
FIG. 16 is an illustrative view of the fifth step in connection with the resin sheet used in the method of manufacturing a module in the first embodiment based on the present disclosure.

As shown with an arrow 91 in FIG. 16, structure 63 shown in FIG. 14 is bonded to a lower surface of structure 62 shown in FIG. 8. In bonding, the structures are heated and pressurized while they are layered on each other. Resin sheet 13 is thus thermally compression-bonded to the lower surface of first sealing resin 6*a*. Module 101 shown in FIGS. 1 and 2 can thus be obtained.

In other words, the columnar conductor itself for external connection has a smaller end surface for meeting demands for reduction in size, however, a large conductive film is formed thereon with the use of the photolithography technique. Therefore, an electrode for external connection having an area large enough to facilitate electrical connection can be obtained. Furthermore, by providing the inexpensive resin sheet by bonding, a module that is inexpensive, can accommodate an error in position displacement, and is high in connection reliability can be obtained.

Second Embodiment

Figure 17:
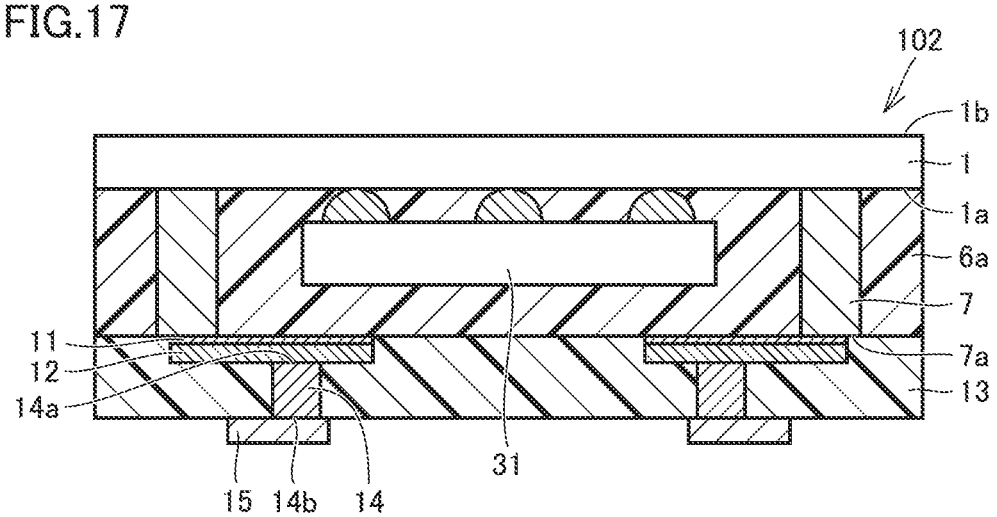
FIG. 17 is a cross-sectional view of a module in a second embodiment based on the present disclosure.

A module in a second embodiment based on the present disclosure will be described with reference to FIG. 17. In a module 102 in the present embodiment, nothing is mounted on second main surface 1*b*. Module 102 is otherwise similar in construction to module 101 shown in the first embodiment. Module 102 is a module, for example, that performs a communication function by containing an antenna, and it has the antenna formed on second main surface 1*b* of substrate 1.

The present embodiment can also obtain an effect similar to the effect of the first embodiment. In module 101 in the first embodiment, components are mounted on opposing surfaces of substrate 1, whereas in module 102 in the present embodiment, components are mounted only on one surface of substrate 1. Therefore, module 102 is more advantageous than module 101 in decrease in thickness of the entire module, although the number of components that can be mounted thereon is smaller.

Third Embodiment

Figure 18:
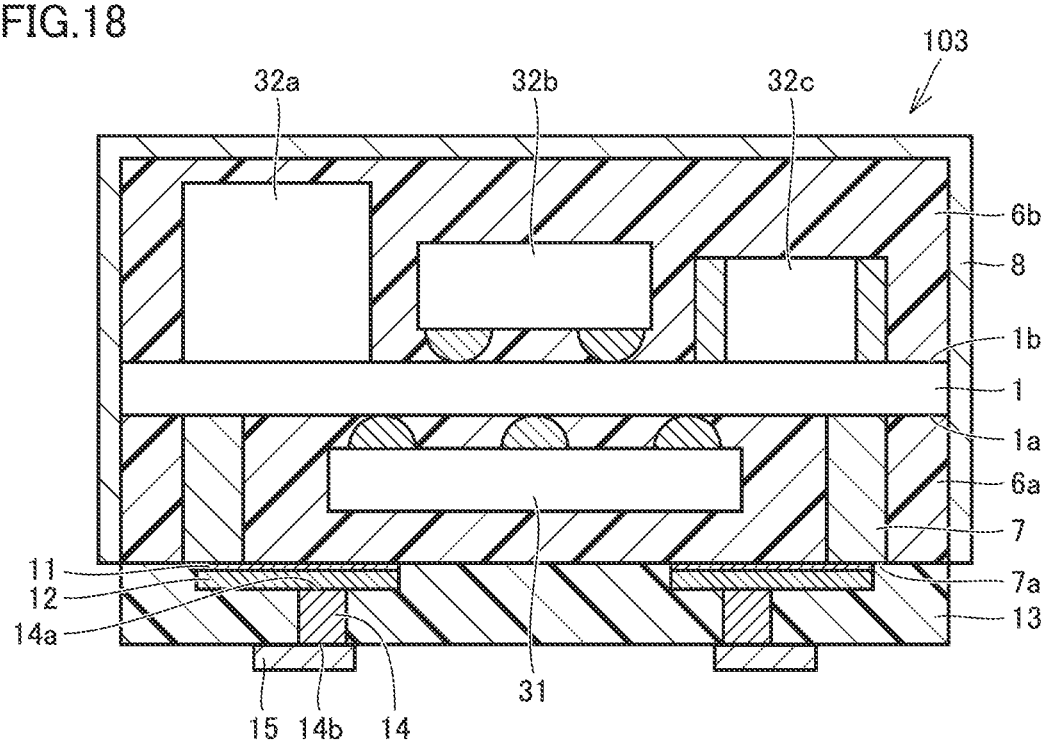
FIG. 18 is a cross-sectional view of a module in a third embodiment based on the present disclosure.

A module in a third embodiment based on the present disclosure will be described with reference to FIG. 18. Though a module 103 in the present embodiment is similar in basic construction to module 101 shown in FIG. 1, it includes features below.

Module 103 includes a second sealing resin 6*b* that seals second main surface 1*b* and a shield film 8 arranged to cover a side surface of first sealing resin 6*a*, a side surface of substrate 1, a side surface of second sealing resin 6b, and a surface of second sealing resin 6b on the side far from substrate 1.

Shield film 8 serves to cut off external radio waves to each component, and it is connected, for example, to a ground electrode (not shown) of substrate 1. Shield film 8 can be in a multi-layered structure including an intimate contact layer, a conductive film layered on the intimate contact layer, and a protective film layered on the conductive film. The intimate contact layer can be formed of a metal such as SUS. The intimate contact layer may be formed of Ti, Cr, Ni, or TiAl. The conductive film is responsible for a substantial shield function of shield film 8, and can be formed, for example, of any metal of Cu, Ag, and Al. The protective film is provided to prevent corrosion or damage of the conductive film, and it can be formed, for example, of SUS. The protective film may be formed of Ti, Cr, Ni, or TiAl.

The present embodiment can also obtain an effect similar to the effect of the first embodiment. Since shield film 8 is provided in the present embodiment, a component mounted on substrate 1 can electromagnetically be shielded.

(Relation Between Conductive Film and First End Surface of Columnar Conductor)

Figure 19:
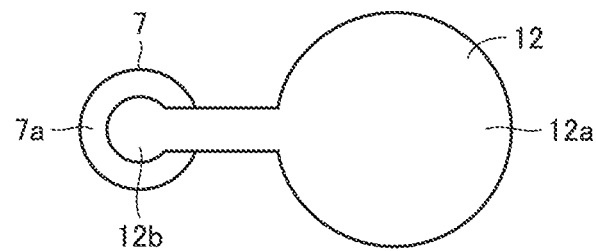
FIG. 19 is a plan view of a first example relating to relation between a conductive film and a first end surface of a columnar conductor.

Relation between the conductive film and the first end surface of the columnar conductor in common to the embodiments will be described. As shown in FIG. 19, in module 101 shown in the first embodiment, conductive film 12 includes a main body 12a substantially in a large circular shape and a projecting portion 12b that extends from main body 12a. Projecting portion 12b has a tip end substantially in a circular shape. The tip end of projecting portion 12b is arranged as being superimposed on first end surface 7a of columnar conductor 7. The center of the circular shape of the tip end of projecting portion 12b does not necessarily have to coincide with the center of first end surface 7a. Projecting portion 12b should only be superimposed on first end surface 7a to such an extent as securing electrical connection therebetween, even when the centers are slightly displaced from each other. Though main body 12a is substantially in the circular shape, it may be substantially in an oval shape or in another shape.

Figure 20:
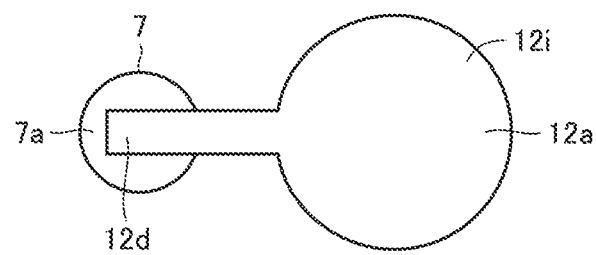
FIG. 20 is a plan view of a second example relating to relation between the conductive film and the first end surface of the columnar conductor.

In a modification of conductive film 12, a conductive film formed like a conductive film 12i shown in FIG. 20 is also applicable. Conductive film 12i includes main body 12a and a projecting portion 12d that extends from main body 12a. Projecting portion 12d extends substantially in a rectangular shape. Though the centerline of projecting portion 12d preferably extends toward the center of first end surface 7a, it may slightly be displaced therefrom. Projecting portion 12d should only be superimposed on first end surface 7a to such an extent as securing electrical connection.

Figure 21:
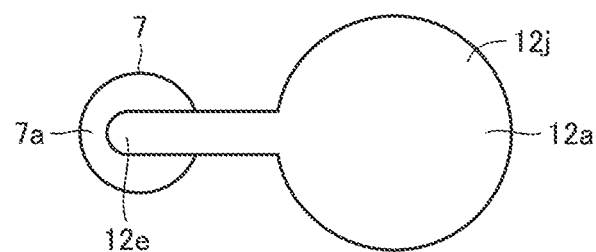
FIG. 21 is a plan view of a third example relating to relation between the conductive film and the first end surface of the columnar conductor.

In a modification of conductive film 12, a conductive film formed like a conductive film 12j shown in FIG. 21 is also applicable. Conductive film 12j includes main body 12a and a projecting portion 12e that extends from main body 12a. Projecting portion 12e extends over a certain width and has a tip end rounded. Though the centerline of projecting portion 12e preferably passes through the center of first end surface 7a, it may slightly be displaced therefrom. Projecting portion 12e should only be superimposed on first end surface 7a to such an extent as securing electrical connection.

Though the diameter of main body 12a is larger than the width of the projecting portion in the examples shown in FIGS. 19 to 21, this relation does not necessarily have to be satisfied. The diameter of main body 12a may be equal to or smaller than the width of the projecting portion. Though the projecting portion includes a portion extending over a certain width in the examples shown in FIGS. 19 to 21, the projecting portion does not necessarily include a portion extending over a certain width. The projecting portion may extend, for example, in a tapered shape gradually changing in width.

Some features in embodiments above may be adopted as being combined as appropriate. It should be understood that the embodiments disclosed herein are illustrative and non-restrictive in every respect. The scope of the present disclosure is defined by the terms of the claims and is intended to include any modifications within the scope and meaning equivalent to the terms of the claims.

1 substrate; 1a first main surface; 1b second main surface; 6a first sealing resin; 6b second sealing resin; 7 columnar conductor; 7a first end surface; 8 shield film; 11 seed layer; 12, 12i, 12j conductive film; 12a main body; 12b, 12d, 12e projecting portion; 13 resin sheet; 13v hole; 14 conductor via; 14a one end; 14b the other end; 15 conductor pattern; 15e conductor foil; 16 surface; 25 resist pattern; 31 first component; 32a, 32b, 32c second component; 61, 62, 63 structure; 91 arrow; 101, 102, 103 module

The invention claimed is:

1. A module comprising:
a substrate including a first main surface and a second main surface facing a direction opposite to the first main surface;
a columnar conductor arranged on the first main surface;
a first sealing resin sealing at least the columnar conductor and the first main surface while exposing a first end surface being an end surface of the columnar conductor on a side far from the substrate;
a conductive film connected to the columnar conductor by covering at least a part of the first end surface and arranged to extend laterally from the first end surface, wherein the conductive film comprises a projecting portion including a wiring portion having a width smaller than a diameter of the first end surface;
a resin sheet arranged to cover at least the conductive film;
a conductor via provided in the resin sheet and having one end connected to the conductive film; and
a conductor pattern arranged on a surface of the resin sheet on the side far from the substrate to be connected to another end of the conductor via and being larger in area than the first end surface.

2. The module according to claim 1, wherein
the conductive film is larger in area than the first end surface and is larger in area than the one end of the conductor via.

3. The module according to claim 2, wherein
at least a first component is mounted on the first main surface, the first component is covered with the first sealing resin, and at least a second component is mounted on the second main surface.

4. The module according to claim 2, comprising:
a second sealing resin sealing the second main surface; and
a shield film arranged to cover a side surface of the first sealing resin, a side surface of the substrate, a side surface of the second sealing resin, and a surface of the second sealing resin on the side far from the substrate.

5. The module according to claim 2, wherein
the conductive film is a plated film.

6. The module according to claim 1, wherein
at least a first component is mounted on the first main surface, the first component is covered with the first sealing resin, and at least a second component is mounted on the second main surface.

7. The module according to claim 6, comprising:
a second sealing resin sealing the second main surface; and
a shield film arranged to cover a side surface of the first sealing resin, a side surface of the substrate, a side surface of the second sealing resin, and a surface of the second sealing resin on the side far from the substrate.

8. The module according to claim 6, wherein
the conductive film is a plated film.

9. The module according to claim 1, comprising:
a second sealing resin sealing the second main surface; and
a shield film arranged to cover a side surface of the first sealing resin, a side surface of the substrate, a side surface of the second sealing resin, and a surface of the second sealing resin on the side far from the substrate.

10. The module according to claim 9, wherein
the conductive film is a plated film.

11. The module according to claim 1, wherein
the conductive film is a plated film.

\* \* \* \* \*